(12) United States Patent
Yamamoto (10) Patent No.: US 10,418,525 B2
(45) Date of Patent: Sep. 17, 2019

(54) SEMICONDUCTOR LIGHT-EMITTING ELEMENT AND LIGHT-EMITTING DEVICE

(71) Applicant: NIKKISO CO., LTD., Tokyo (JP)

(72) Inventor: Shuichiro Yamamoto, Ishikawa (JP)

(73) Assignee: NIKKISO CO., LTD., Tokyo (JP)

(*) Notice: Subject to any disclaimer, the term of this patent is extended or adjusted under 35 U.S.C. 154(b) by 0 days.

(21) Appl. No.: 16/100,705

(22) Filed: Aug. 10, 2018

(65) Prior Publication Data

US 2019/0103519 A1 Apr. 4, 2019

(30) Foreign Application Priority Data

Sep. 29, 2017 (JP) .................................. 2017-189505

(51) Int. Cl.
| | |
|---|---|
| H01L 33/42 | (2010.01) |
| H01L 33/48 | (2010.01) |
| H01L 33/32 | (2010.01) |
| H01L 33/56 | (2010.01) |
| H01L 33/62 | (2010.01) |
| H01L 33/58 | (2010.01) |

(52) U.S. Cl.
CPC .............. *H01L 33/42* (2013.01); *H01L 33/32* (2013.01); *H01L 33/486* (2013.01); *H01L 33/56* (2013.01); *H01L 33/62* (2013.01); *H01L 33/58* (2013.01)

(58) Field of Classification Search
CPC ....................................................... H01L 33/42
See application file for complete search history.

(56) References Cited

U.S. PATENT DOCUMENTS

2010/0327311 A1* 12/2010 Kaji ....................... B82Y 20/00
257/103

FOREIGN PATENT DOCUMENTS

JP          2007-067184 A        3/2007

* cited by examiner

*Primary Examiner* — William A Harriston
(74) *Attorney, Agent, or Firm* — Scully Scott Murphy and Presser

(57) ABSTRACT

Provided is a semiconductor light-emitting element that emits ultraviolet light with a wavelength of not more than 355 nm, the semiconductor light-emitting element including an electrode portion to be electrically connected to electrodes of a component mounting the element, wherein the electrode portion is formed by laminating any one or more of a metal providing passivity against organic acids, a metal having a lower ionization tendency than hydrogen and a conductive oxide film, and does not include a layer formed of a material that does not provide passivity against organic acids, has higher ionization tendency than hydrogen and is not a conductive oxide film.

5 Claims, 6 Drawing Sheets

SEMICONDUCTOR LIGHT-EMITTING ELEMENT AND LIGHT-EMITTING DEVICE

CROSS REFERENCE TO RELATED APPLICATIONS

The present application is based on Japanese patent application No. 2017-189505 filed on Sep. 29, 2017, the entire contents of which are incorporated herein by reference.

TECHNICAL FIELD

The invention relates to a semiconductor light-emitting element that emits ultraviolet light, and a light-emitting device.

BACKGROUND ART

A conventional resin-sealed light-emitting device is known, in which a light-emitting diode (LED) is sealed with a sealing resin such as silicone resin (see, e.g., JP 2007/067184). Resin-sealed light-emitting device is often configured that the sealing resin covers the entire LED including an electrode structure.

CITATION LIST

Patent Literatures

JP 2007/067184

SUMMARY OF INVENTION

Technical Problem

The present inventors studied a resin-sealed light-emitting device of which light-emitting diode is an ultraviolet light-emitting diode emitting ultraviolet light with a wavelength of not more than 355 nm (hereinafter, referred to as "UV LED"). As a result, the following problems were found.

When an UV LED with a wavelength of not more than 355 nm is sealed with a resin, ultraviolet light accelerates a dissociation reaction in which an alkyl group or a functional group containing carbon, etc., used as a side chain of the sealing resin is cut off from a main chain. When bonds in the side chain of the sealing resin are broken by ultraviolet light, organic acids such as carboxylic acid are produced from the decomposition products of the side chain and may cause corrosion of an electrode portion of the UV LED. As a result of further study, the present inventors found that formation of organic acids from the decomposition products of the side chain is accelerated especially in a high-temperature and high-humidity atmosphere, resulting in more significant deterioration of the electrode portion.

It is an object of the invention to provide a semiconductor light-emitting element and a light-emitting device in which corrosion of an electrode portion is less likely to occur when sealed with a resin.

Solution to Problem

An embodiment of the invention provides a semiconductor light-emitting element that emits ultraviolet light with a wavelength of not more than 355 nm, the semiconductor light-emitting element comprising:

an electrode portion to be electrically connected to electrodes of a component mounting the element, wherein the electrode portion is formed by laminating any one or more of a metal providing passivity against organic acids, a metal having a lower ionization tendency than hydrogen and a conductive oxide film, and does not include a layer formed of a material that does not provide passivity against organic acids, has higher ionization tendency than hydrogen and is not a conductive oxide film.

An embodiment of the invention provides a light-emitting device, comprising:

a package with electrodes;

a semiconductor light-emitting element that has an electrode portion electrically connected to the electrodes and emits ultraviolet light with a wavelength of not more than 355 nm; and a sealing resin that seals the semiconductor light-emitting element and is in contact with the electrode portion, wherein the sealing resin has an alkyl group or a functional group containing carbon in a side chain, and the electrode portion is formed by laminating any one or more of a metal providing passivity against organic acids, a metal having a lower ionization tendency than hydrogen and a conductive oxide film, and does not include a layer formed of a material that does not provide passivity against organic acids, has higher ionization tendency than hydrogen and is not a conductive oxide film.

Advantageous Effects of Invention

According to an embodiment of the invention, a semiconductor light-emitting element and a light-emitting device can be provided in which corrosion of an electrode portion is less likely to occur when sealed with a resin.

DESCRIPTION OF EMBODIMENTS

An embodiment of the invention will be described below in conjunction with the appended drawings.

Figure 1:
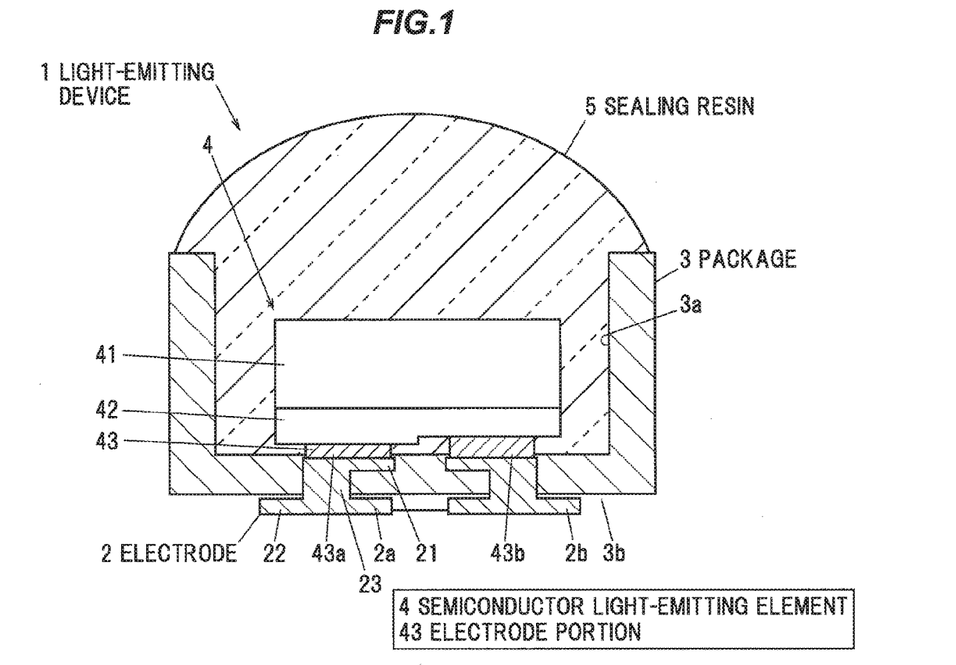
FIG. 1 is a cross sectional view showing a light-emitting device using a semiconductor light-emitting element in an embodiment of the present invention.
Figure 2:
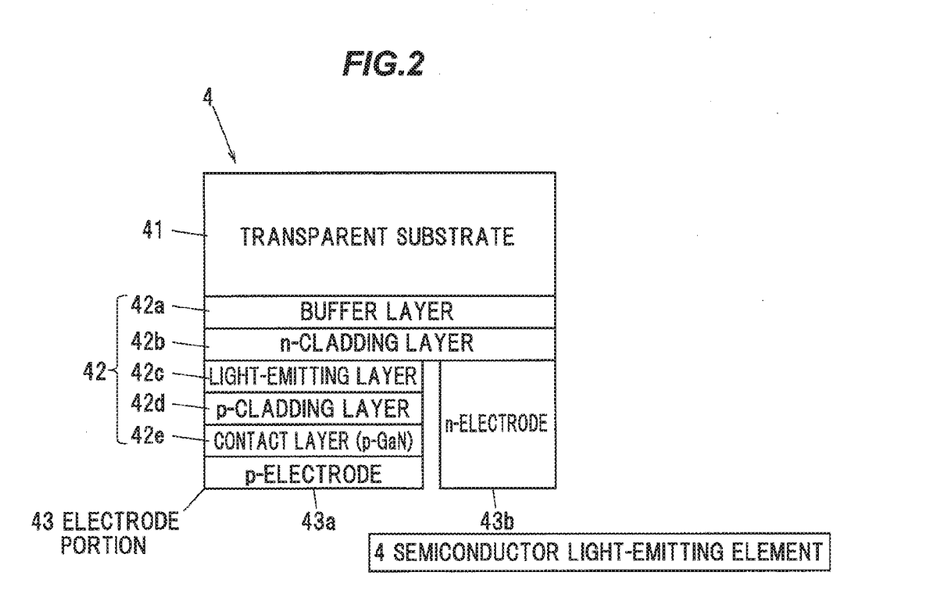
FIG. 2 is an explanatory diagram illustrating a laminated structure of the semiconductor light-emitting element.

FIG. 1 is a cross sectional view showing a light-emitting device using a semiconductor light-emitting element in the present embodiment. FIG. 2 is an explanatory diagram illustrating a laminated structure of the semiconductor light-emitting element.

A light-emitting device 1 is provided with a package 3 provided with electrodes 2, a semiconductor light-emitting element 4 having an electrode portion 43 electrically connected to the electrodes 2, and a sealing resin 5 sealing the semiconductor light-emitting element.

The package 3 is formed in a rectangular parallelepiped shape and has a recessed portion 3a on the upper surface thereof. The package 3 is formed of, e.g., a high temperature co-fired ceramic (HTCC) multilayer substrate.

The electrode 2 is exposed from a bottom wall 3b of the package 3 inside the recessed portion 3a and integrally has an element mounting portion 21, a circuit mounting portion 22 and a coupling portion 23. The element mounting portion 21 is a portion on which the semiconductor light-emitting element 4 is mounted. The circuit mounting portion 22 is a portion exposed from the bottom wall 3b of the package 3 on the lower side (on the opposite side to the recessed portion 3a) and electrically connected to a circuit board (not shown), etc., by solder, etc. The coupling portion 23 is a portion which couples the element mounting portion 21 to the circuit mounting portion 22. The light-emitting device 1 has a pair of electrodes 2 consisting of an anode-side electrode 2a and a cathode-side electrode 2b.

The semiconductor light-emitting element 4 is constructed from an UV LED which emits ultraviolet light with a wavelength of not more than 355 nm. The semiconductor light-emitting element 4 has a transparent substrate 41 constructed from a sapphire substrate, an AlGaN-based nitride semiconductor layer 42 formed on the transparent substrate 41, and the electrode portion 43. As shown in FIG. 2, in the present embodiment, the nitride semiconductor layer 42 is composed of a buffer layer 42a formed of AlN, an n-cladding layer 42b formed of n-type AlGaN, a light-emitting layer 42c containing AlGaN, a p-cladding layer 42d formed of p-type AlGaN and a contact layer 42e formed of p-type GaN, which are sequentially formed in this order from the transparent substrate 41 side. The electrode portion 43 is composed of an anode-side electrode portion (p-electrode) 43a formed on the contact layer 42e and a cathode-side electrode portion (n-electrode) 43b formed on the n-type cladding layer. The materials of the two electrode portions 43a and 43b will be described later.

The semiconductor light-emitting element 4 is flip-chip mounted on the bottom wall 3b (on the electrodes 2) such that the transparent substrate 41 is located on the upper side (on the opposite side to the bottom wall 3b). The electrode portion 43 is connected to the electrodes 2 via, e.g., gold bumps, etc. The anode-side electrode portion 43a of the semiconductor light-emitting element 4 is electrically connected to the element mounting portion 21 of the anode-side electrode 2a, and the cathode-side electrode portion 43b of the semiconductor light-emitting element 4 is electrically connected to the element mounting portion 21 of the cathode-side electrode 2b.

The sealing resin 5 is provided to cover the entire semiconductor light-emitting element 4 including the electrode portion 43. That is, the sealing resin 5 is directly in contact with the electrode portion 43. The sealing resin 5 is provided to fill the recessed portion 3a of the package 3 and is formed to bulge upward above the package 3 in such a manner that the upper surface thereof has a smoothly curved shape (e.g., a hemispherical shape or a semi-elliptical shape). In this configuration, total reflection at an interface between the sealing resin and the air can be reduced as compared to when the upper surface is, e.g., flat, and light extraction efficiency can be thereby improved. In addition, the sealing resin 5 serves as a lens and thus allows for control of the direction of the emitted ultraviolet light. Meanwhile, the sealing resin 5 used here desirably has a refractive index between the refractive index of the sapphire substrate as the transparent substrate 41 and the refractive index of the air. This improves efficiency of extracting ultraviolet light from the sapphire substrate, thereby contributing to improvement in emission intensity.

In other words, the sealing resin 5 serves to protect the semiconductor light-emitting element 4 by covering the semiconductor light-emitting element 4, serves to improve light extraction efficiency by reducing a refractive index difference between the transparent substrate 41 and the air, and also serves as a lens to control the direction of the emitted ultraviolet light.

Figure 3:
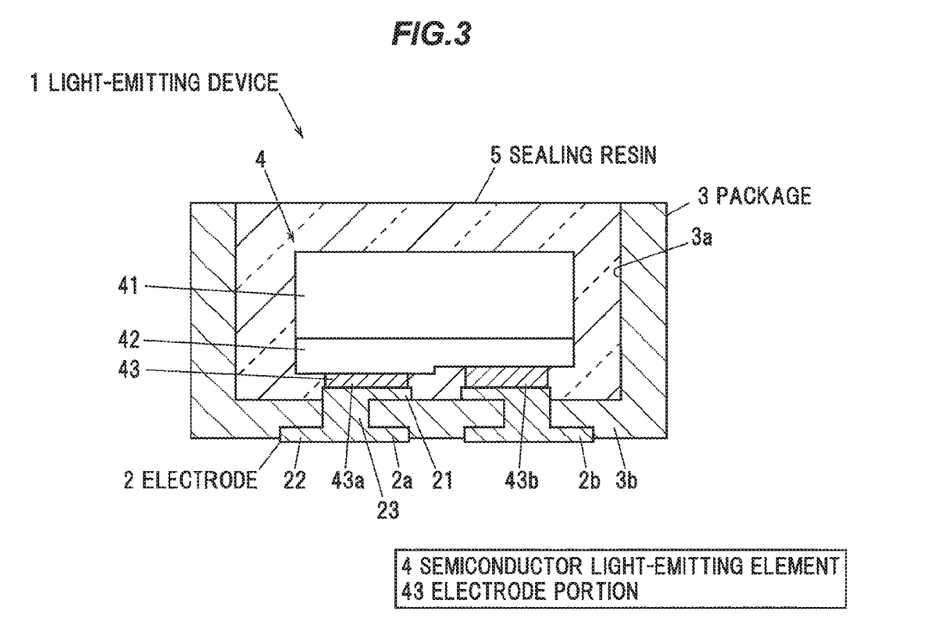
FIG. 3 is a cross sectional view showing a light-emitting device in a modification of the invention.
Figure 4:
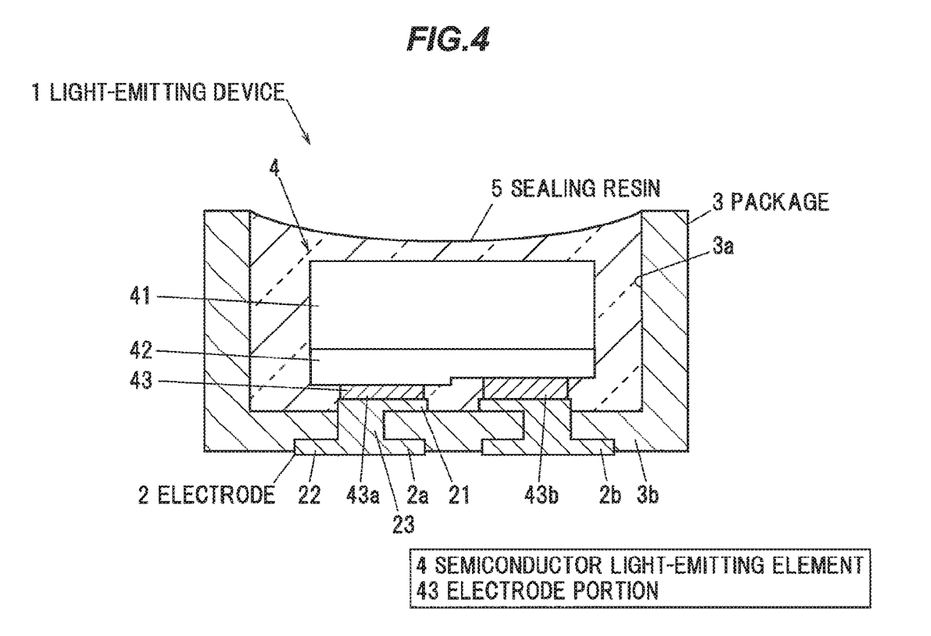
FIG. 4 is a cross sectional view showing a light-emitting device in another modification of the invention.
Figure 5:
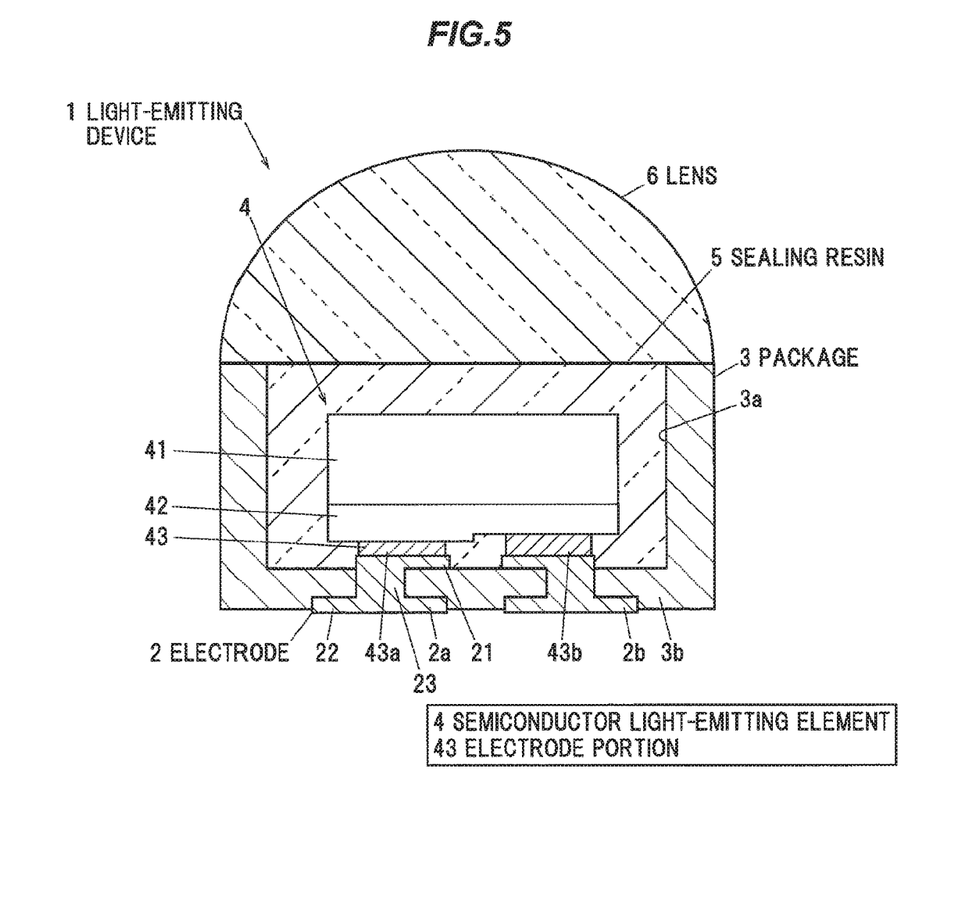
FIG. 5 is a cross sectional view showing a light-emitting device in another modification of the invention.

Alternatively, the sealing resin 5 in the recessed portion 3a of the package 3 may be flat as shown in FIG. 3 or concave as shown in FIG. 4. As another alternative, a lens 6 formed of quartz or sapphire, etc., may be attached onto the flat sealing resin 5 as shown in FIG. 5. The shape of the lens 6 may be a hemispherical shape as shown in FIG. 5, or a non-spherical shape such as convex shape or concave shape, or other shapes.

It is desirable to use the sealing resin 5 which is transparent to ultraviolet light emitted from the semiconductor light-emitting element 4 and also does not easily deteriorate even when exposed to ultraviolet light. In detail, a silicone resin or a fluorine resin can be used as the sealing resin 5.

The side chain of the silicone resin used as the sealing resin 5 is composed of an alkyl group such as $CH_3$, but a portion of the side chain may be substituted with a functional group containing carbon, such as carboxyl group, to improve characteristics of the sealing resin, e.g., to improve adhesion. Likewise, the fluorine resin may also have a carboxyl group, etc., containing carbon as the side chain to enhance adhesion. In case of using the fluorine resin, it is desirable to seal the package 3 and the semiconductor light-emitting element 4 with the sealing resin 5 after further improving adhesion therebetween by pretreatment with a silane coupling agent, etc.

When using the sealing resin 5 having an alkyl group or a functional group containing carbon in the side chain, the alkyl group or the functional group containing carbon, etc., which is used as the side chain of the sealing resin 5, may be cut off from the main chain due to ultraviolet light. When the bonds in the side chain of the sealing resin 5 are broken due to ultraviolet light, organic acids such as carboxylic acid are produced from the decomposition products of the side chain. This may cause corrosion of the electrode portion 43 if the electrode portion 43 is formed of nickel, etc., which has higher ionization tendency and low resistance to acid, etc.

Therefore, in the present embodiment, the electrode portion 43 is formed of a less corrosive or non-corrosive material so as to prevent the property degradation and reduction in lifetime due to corrosion of the electrode portion 43.

In more detail, the electrode portion 43 in the present embodiment is formed by laminating any one or more of a metal providing passivity against organic acids, a metal having a lower ionization tendency than hydrogen and a conductive oxide film. The electrode portion 43 does not include a layer formed of nickel, etc., which is a material which does not provide passivity against organic acids, has higher ionization tendency than hydrogen and is not a conductive oxide film.

Examples of the metal providing passivity against organic acids include chrome, aluminum, titanium, hafnium, zirconium and tantalum, etc. Examples of the metal having a lower ionization tendency than hydrogen include copper, silver, palladium, platinum and gold, etc. Examples of the conductive oxide film include ITO (Indium Tin Oxide) and IGZO (In—Ga—ZnO$_4$), etc. The electrode portion 43 is formed by combining only materials in these three groups.

In the present embodiment, titanium, which is a metal providing passivity against organic acids, is used in place of nickel which would be use to form the anode-side electrode portion 43a in the conventional technique. In other words, the electrode portion 43 includes a layer formed of titanium as the metal providing passivity against organic acids. When using titanium, a titanium oxide formed on the surface thereof acts as passivation and thus has properties of not being eroded by organic acids produced by decomposition of the sealing resin 5.

In the present embodiment, the anode-side electrode portion 43a is formed by sequentially laminating ITO as the conductive oxide film, titanium as the metal providing passivity against organic acids and gold as the metal having a lower ionization tendency than hydrogen, from the nitride semiconductor layer 42 side (the contact layer 42e side) toward the electrode 2 side. Meanwhile, the cathode-side electrode portion 43b is formed by sequentially laminating titanium, aluminum, titanium and gold from the nitride semiconductor layer 42 side (the n-cladding layer 42b side) toward the electrode 2 side. The thickness and the number of each layer of the electrode portion 43 are not specifically limited here and can be appropriately adjusted.
(Modification)

To form the anode-side electrode portion 43a, palladium which is a metal having a lower ionization tendency than hydrogen may be used in place of conventionally used nickel. In other words, the electrode portion 43 may include a layer formed of palladium which is a metal having a lower ionization tendency than hydrogen. Palladium has a lower ionization tendency than hydrogen and thus has properties of not being eroded by organic acids produced by decomposition of the sealing resin 5. In this case, the anode-side electrode portion 43a is formed by sequentially laminating ITO as the conductive oxide film, palladium as the metal having a lower ionization tendency than hydrogen and gold as the metal having a lower ionization tendency than hydrogen, from the nitride semiconductor layer 42 side (the contact layer 42e side) toward the electrode 2 side. Meanwhile, the cathode-side electrode portion 43b is formed by sequentially laminating titanium, aluminum, titanium and gold from the nitride semiconductor layer 42 side (the n-cladding layer 42b side) toward the electrode 2 side. The thickness and the number of each layer of the electrode portion 43 are not specifically limited here and can be appropriately adjusted.

Figure 6:
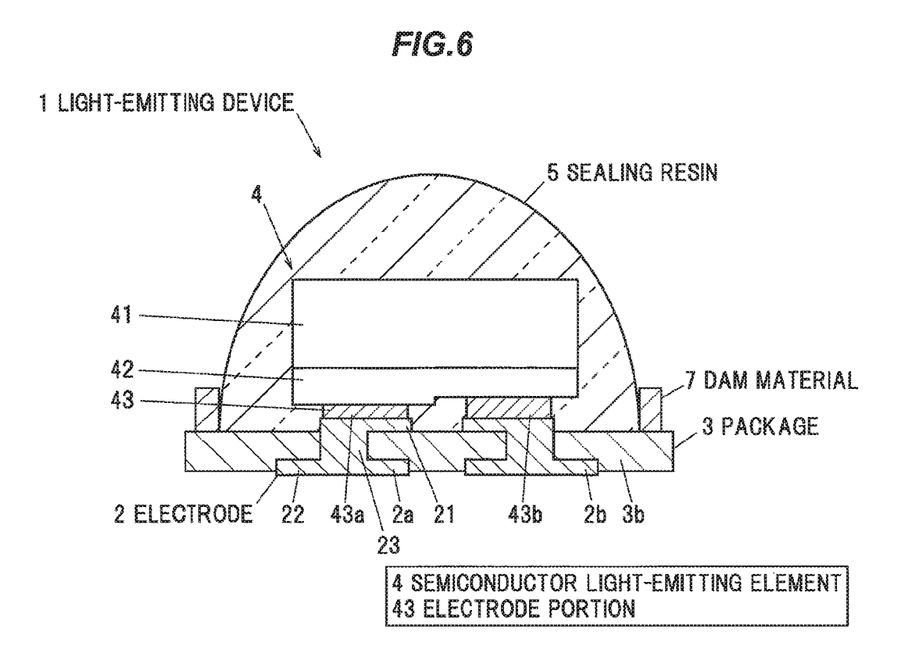
FIG. 6 is a cross sectional view showing a light-emitting device in another modification of the invention.

As an alternative, the package 3 may be formed in a plate shape as shown in FIG. 6. In this case, the sealing resin 5 only needs to be formed to cover the entire semiconductor light-emitting element 4 and can be molded into a desired shape such as hemispherical shape by using a mold, etc. Although FIG. 6 shows an example in which a dam material 7 for preventing the sealing resin 5 from flowing out is formed on the package 3, the dam material 7 may be removed after molding the sealing resin 5.

Effects of the Embodiment

Before describing the functions and effects, the mechanism causing corrosion of an electrode portion in conventional semiconductor light-emitting element will be described in detail.

When a semiconductor light-emitting element emitting ultraviolet light with a wavelength of not more than 355 nm is sealed with a resin, corrosion of an electrode portion of the semiconductor light-emitting element occurs and deterioration of the electrode portion becomes more pronounced particularly in a high-temperature and high-humidity atmosphere. As a result of study on the cause of the deterioration of the electrode portion, the present inventors found that organic acids such as carboxylic acid are produced and cause corrosion of the electrode portion. As a result of further study on what causes formation of the organic acids, the present inventors found out that the sealing resin is decomposed due to ultraviolet light emitted from the semiconductor light-emitting element and further oxidation occurs due to moisture and the ultraviolet light, resulting in that organic acids are produced from decomposition products of the side chain. It was also found that the decomposition of the resin occurs mainly at the Si—C bonds.

The bond energy of the Si—C bonds in the sealing resin is 80.5 kcal/mol which corresponds to 355 nm in terms of wavelength of light. Therefore, when exposed to ultraviolet light with a wavelength shorter than 355 nm, light absorption via impurities occurs and may break the Si—C bonds. When a silicone resin is used as the sealing resin, since the bonds in the side chain of the silicon resin are mainly the Si—C bonds, an alkyl group or functional group, etc., detached from the side chain captures energy of ultraviolet light and organic acids are produced from some of decomposition products. Then, corrosion of the electrode portion occurs due to the organic acids. It is considered that in high-temperature and high-humidity conditions, formation of the organic acids is accelerated and corrosion of the electrode portion is thus more accelerated.

When a fluorine resin is used as the sealing resin, it is necessary to use a surface modifier such as silane coupling agent to make up for weak adhesion of the fluorine resin and also to form a functional group such as —COOH in the side chain of the fluorine resin. In this case, the Si—C bond is formed between Si formed by the silane coupling agent and the side chain of the resin. This bond may be broken due to light with a wavelength of not more than 355 nm, as previously mentioned. Furthermore, the bond in the side chain formed in the fluorine resin is a C—C bond, etc., and can be easily broken by ultraviolet light of about 350 nm. Therefore, also when using the fluorine resin as the sealing resin, organic acids are produced from some of the decomposition products and cause corrosion of the electrode portion in the same manner as when using the silicone resin. The fluorine resin could be used as the sealing resin without improving adhesion. In this case, however, adhesion of the sealing resin to the package, the semiconductor light-emitting element and the electrode, etc., is insufficient, hence, the sealing resin comes off and a sufficient sealing effect is not obtained.

Such corrosion of the electrode portion of the semiconductor light-emitting element is a particular problem when using a semiconductor light-emitting element emitting ultraviolet light with a wavelength of not more than 355 nm. When an UV LED, blue LED or white LED with an emission peak wavelength of not less than 355 nm is used as a semiconductor light-emitting element, the rate of decomposition of the sealing resin due to the emitted light is significantly slow and there is thus no significant problem of corrosion of the electrode portion.

Based on this fact, the electrode portion 43, which is less likely to corrode even when organic acids are produced, is used in the present embodiment. That is, the semiconductor light-emitting element 4 in the present embodiment emits ultraviolet light with a wavelength of not more than 355 nm, and is configured that the electrode portion 43 is formed by laminating any one or more of a metal providing passivity against organic acids, a metal having a lower ionization tendency than hydrogen and a conductive oxide film and does not include a layer formed a material which does not provide passivity against organic acids, has higher ionization tendency than hydrogen and is not a conductive oxide film.

As a result, even when the semiconductor light-emitting element 4 is sealed with the sealing resin 5, it is possible to prevent corrosion of the electrode portion 43 due to organic acids produced by decomposition of the side chain of the sealing resin 5 by ultraviolet light and thus possible to prevent failure such as discoloration or faulty electrical conduction from occurring. In other words, it is possible to realize the semiconductor light-emitting element 4 in which corrosion of the electrode portion 43 is less likely to occur when sealed with a resin, and it is thus possible to improve reliability and lifetime.

Conventionally, particularly in a high-temperature and high-humidity atmosphere, formation of organic acids from decomposition products of the side chain is accelerated and deterioration of the electrode portion is particularly pronounced. It is considered that this is because when the semiconductor light-emitting element 4 emits light in a high-temperature and high-humidity atmosphere, decomposition products of the sealing resin 5 and moisture are likely to turn into organic acids, etc., due to light energy. In the semiconductor light-emitting element 4 in the present embodiment, corrosion of the electrode portion 43 is less likely to occur even when used in such high-temperature and high-humidity atmosphere and high reliability is obtained.

Technical ideas understood from the embodiment will be described below citing the reference numerals, etc., used for the embodiment. However, each reference numeral, etc., described below is not intended to limit the constituent elements in the claims to the members, etc., specifically described in the embodiment.

[1] A semiconductor light-emitting element (4) that emits ultraviolet light with a wavelength of not more than 355 nm, the semiconductor light-emitting element (4) comprising: an electrode portion (43) to be electrically connected to electrodes (2) of a component mounting the element, wherein the electrode portion (43) is formed by laminating any one or more of a metal providing passivity against organic acids, a metal having a lower ionization tendency than hydrogen and a conductive oxide film, and does not include a layer formed of a material that does not provide passivity against organic acids, has higher ionization tendency than hydrogen and is not a conductive oxide film.

[2] A light-emitting device (1), comprising: a package (3) with electrodes (2); a semiconductor light-emitting element (4) that has an electrode portion (43) electrically connected to the electrodes (2) and emits ultraviolet light with a wavelength of not more than 355 nm; and a sealing resin (5) that seals the semiconductor light-emitting element (4) and is in contact with the electrode portion (43), wherein the sealing resin (5) has an alkyl group or a functional group containing carbon in a side chain, and the electrode portion (43) is formed by laminating any one or more of a metal providing passivity against organic acids, a metal having a lower ionization tendency than hydrogen and a conductive oxide film, and does not include a layer formed of a material that does not provide passivity against organic acids, has higher ionization tendency than hydrogen and is not a conductive oxide film.

[3] The light-emitting device (1) defined by [2], wherein the electrode portion (43) comprises a layer comprising titanium that is a metal providing passivity against organic acids.

[4] The light-emitting device (1) defined by [3], wherein the semiconductor light-emitting element (4) comprises a light-emitting diode, the electrode portion (43) comprises an anode-side electrode portion (43a) and a cathode-side electrode portion (43b), and the anode-side electrode portion (43a) is formed by subsequently laminating ITO as a conductive oxide film, titanium as a metal providing passivity against organic acids, and gold as a metal having a lower ionization tendency than hydrogen.

[5] The light-emitting device (1) defined by [2], wherein the electrode portion (43) comprises a layer comprising palladium that is a metal having a lower ionization tendency than hydrogen.

[6] The light-emitting device (1) defined by [5], wherein the semiconductor light-emitting element (4) comprises a light-emitting diode, the electrode portion (43) comprises an anode-side electrode portion (43a) and a cathode-side electrode portion (43b), and the anode-side electrode portion (43a) is formed by subsequently laminating ITO as a conductive oxide film, palladium as a metal having a lower ionization tendency than hydrogen, and gold as a metal having a lower ionization tendency than hydrogen.

Although the embodiment of the invention has been described, the invention according to claims is not to be limited to the embodiment described above. Further, please note that all combinations of the features described in the embodiment are not necessary to solve the problem of the invention.

Figure 7:
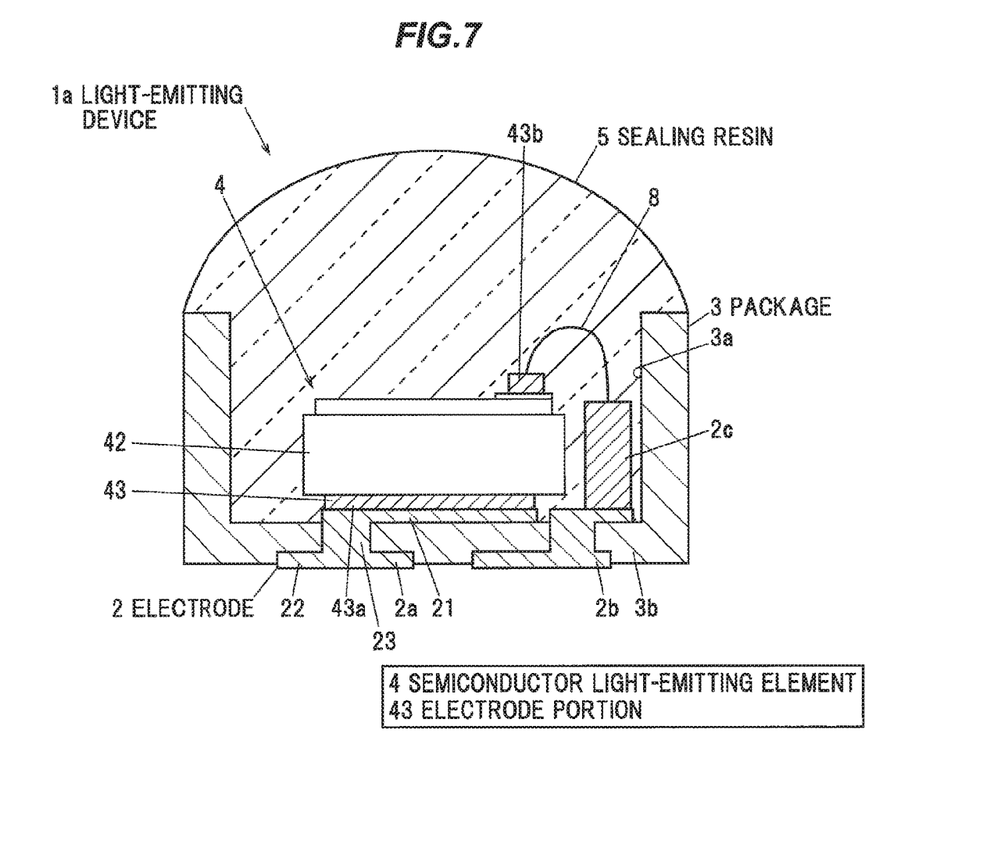
FIG. 7 is a cross sectional view showing a light-emitting device using a semiconductor light-emitting element in a modification of the invention.

The invention can be appropriately modified and implemented without departing from the gist thereof. For example, although the semiconductor light-emitting element 4 is flip-chip mounted in the embodiment, the semiconductor light-emitting element 4 may be mounted by wire bonding in such a manner that the electrode portion 43 is connected to the electrode 2 via a wire 8 as in a light-emitting device 1a shown in FIG. 7. In the example shown in FIG. 7, the sapphire substrate as the transparent substrate 41 is removed, the cathode-side electrode portion 43b is formed on the upper surface of the nitride semiconductor layer 42 (on the buffer layer 42a), and the wire 8 formed of gold, etc., is used to electrically connect the cathode-side electrode portion 43b to a conductive post 2c provided on the cathode-side electrode 2b of the package 3.

REFERENCE SIGNS LIST

1 LIGHT-EMITTING DEVICE
2 ELECTRODES
3 PACKAGE
4 SEMICONDUCTOR LIGHT-EMITTING ELEMENT
43 ELECTRODE PORTION
43a ANODE-SIDE ELECTRODE PORTION
43b CATHODE-SIDE ELECTRODE PORTION
5 SEALING RESIN

The invention claimed is:
1. A light-emitting device, comprising:
a package with electrodes;
a semiconductor light-emitting element that has an electrode portion electrically connected to the electrodes and emits ultraviolet light with a wavelength of not more than 355 nm; and a sealing resin that seals the semiconductor light-emitting element and is in contact with the electrode portion, wherein the sealing resin has an alkyl group or a functional group containing carbon in a side chain, and the electrode portion is formed by laminating any one or more of a metal providing passivity against organic acids, a metal having a lower ionization tendency than hydrogen and a conductive oxide film, and does not include a layer formed of a material that does not provide passivity against organic acids, has higher ionization tendency than hydrogen and is not a conductive oxide film.

2. The light-emitting device according to claim 1, wherein the electrode portion comprises a layer comprising titanium that is a metal providing passivity against organic acids.

3. The light-emitting device according to claim 2, wherein the semiconductor light-emitting element comprises a light-emitting diode, the electrode portion comprises an anode-side electrode portion and a cathode-side electrode portion, and the anode-side electrode portion is formed by subsequently laminating ITO as a conductive oxide film, titanium as a metal providing passivity against organic acids, and gold as a metal having a lower ionization tendency than hydrogen.

4. The light-emitting device according to claim 1, wherein the electrode portion comprises a layer comprising palladium that is a metal having a lower ionization tendency than hydrogen.

5. The light-emitting device according to claim 4, wherein the semiconductor light-emitting element comprises a light-emitting diode, the electrode portion comprises an anode-side electrode portion and a cathode-side electrode portion, and the anode-side electrode portion is formed by subsequently laminating ITO as a conductive oxide film, palladium as a metal having a lower ionization tendency than hydrogen, and gold as a metal having a lower ionization tendency than hydrogen.

* * * * *